(12) United States Patent
Lee

(10) Patent No.: US 10,083,980 B2
(45) Date of Patent: Sep. 25, 2018

(54) SEMICONDUCTOR MEMORY DEVICE AND METHOD OF MANUFACTURING THE SAME

(71) Applicant: SK hynix Inc., Icheon-si, Gyeonggi-do (KR)

(72) Inventor: Hyun Ho Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 80 days.

(21) Appl. No.: 14/607,310

(22) Filed: Jan. 28, 2015

(65) Prior Publication Data
US 2016/0071869 A1 Mar. 10, 2016

(30) Foreign Application Priority Data
Sep. 4, 2014 (KR) .................. 10-2014-0117662

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/28008* (2013.01); *H01L 21/31* (2013.01); *H01L 21/31116* (2013.01); *H01L 21/324* (2013.01); *H01L 21/32115* (2013.01); *H01L 21/76895* (2013.01); *H01L 29/1037* (2013.01); *H01L 29/513* (2013.01); *H01L 29/66833* (2013.01); *H01L 29/7926* (2013.01)

(58) Field of Classification Search
CPC ........... H01L 27/11582; H01L 29/7926; H01L 23/528; H01L 29/513; H01L 21/28008; H01L 21/3205; H01L 21/31; H01L 21/31116; H01L 21/32115; H01L 21/76897; H01L 21/324; H01L 27/11556; H01L 29/66825; H01L 29/66833; H01L 29/7889; H01L 29/4234
See application file for complete search history.

(56) References Cited

U.S. PATENT DOCUMENTS

2012/0083077 A1* 4/2012 Yang .................. H01L 27/11582 438/156
2012/0299005 A1* 11/2012 Lee .................... H01L 27/11582 257/66
(Continued)

FOREIGN PATENT DOCUMENTS

KR 1020060038587 A 5/2006
KR 1020140025631 A 3/2014

*Primary Examiner* — Fernando L Toledo
*Assistant Examiner* — Lawrence-Linh T Nguyen
(74) *Attorney, Agent, or Firm* — William Park & Associates Ltd.

(57) ABSTRACT

The semiconductor memory device includes a stacked structure including conductive patterns and interlayer insulating patterns which are alternately stacked, a through-hole configured to pass through the stacked structure; a channel pattern formed inside the through-hole, a first capping conductive pattern formed on the channel pattern, a second capping conductive pattern formed on a sidewall of the first capping conductive pattern and surrounding the first capping conductive pattern, and a contact plug formed on the first capping conductive pattern and the second capping conductive pattern.

9 Claims, 7 Drawing Sheets

(51) Int. Cl.

| | |
|---|---|
| *H01L 29/792* | (2006.01) |
| *H01L 29/51* | (2006.01) |
| *H01L 29/10* | (2006.01) |
| *H01L 21/28* | (2006.01) |
| *H01L 21/31* | (2006.01) |
| *H01L 21/311* | (2006.01) |
| *H01L 21/321* | (2006.01) |
| *H01L 21/324* | (2006.01) |
| *H01L 29/66* | (2006.01) |
| *H01L 21/768* | (2006.01) |

(56) References Cited

U.S. PATENT DOCUMENTS

| | | | |
|---|---|---|---|
| 2013/0155771 A1* | 6/2013 | Kim | H01L 29/66833 365/185.05 |
| 2014/0084357 A1* | 3/2014 | Choi | H01L 27/1157 257/324 |
| 2015/0004777 A1* | 1/2015 | Kohji | H01L 21/28282 438/486 |

* cited by examiner

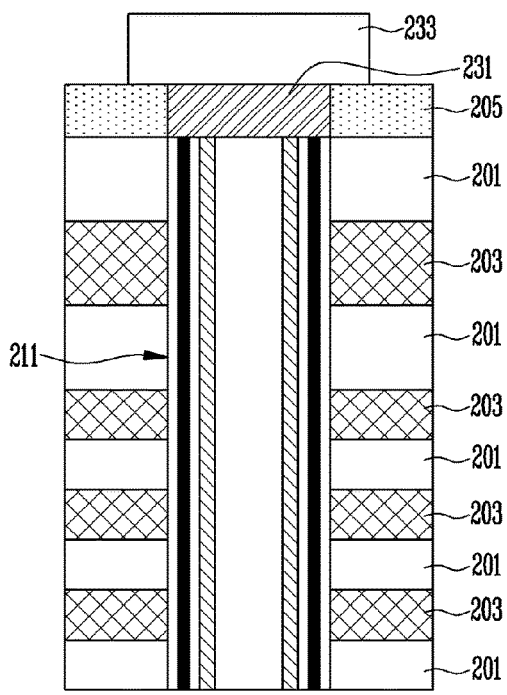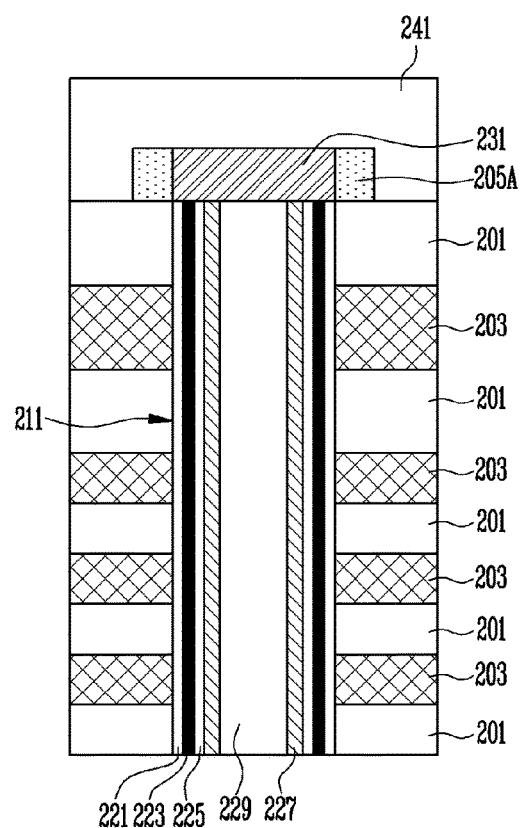

SEMICONDUCTOR MEMORY DEVICE AND METHOD OF MANUFACTURING THE SAME

CROSS-REFERENCE TO RELATED APPLICATION

The present application claims priority to Korean patent application number 10-2014-0117662 filed on Sep. 4, 2014, in the Korean Intellectual Property Office, the entire disclosure of which is incorporated by reference herein.

BACKGROUND

Technical Field

The invention relates to a semiconductor device, more particularly, to a semiconductor memory device and a method of manufacturing the same.

Related Art

According to development of an industry concerning a memory device such as a nonvolatile memory device, and/or the like, requirements for high integration of the memory device are being increased. In a memory device, the size of memory cells arranged in 2-dimensional structure on a semiconductor device is decreased so as to increase the integration of the memory devices in a predetermined area. However, the decrease of the size of the memory cells has a physical limitation. Thus, a 3-dimensional structure including memory cells stacked on the semiconductor substrate has been developed recently. When the memory cells are arranged in the 3-dimensional structure, the area of the semiconductor substrate is efficiently used, and the memory cells of the 3-dimensional structure have a higher integration than the memory cells of the 2-dimensional structure. In particular, when memory strings of a NAND flash memory device, which is advantageous for the high integration, are arranged in the 3-dimensional structure and form a 3-dimensional NAND flash memory device, the maximum integration of the memory device is expected. Thus, the development of the 3-dimensional semiconductor memory device is required.

The 3-dimensional semiconductor memory device includes word lines which are spaced apart from each other and stacked on a substrate, a channel layer which passes through the word lines and aligned perpendicular to the substrate, a tunnel insulating layer surrounding the channel layer, a charge storage layer surrounding the tunnel insulating layer, and a blocking insulating layer surrounding the charge storing layer. Since charges are trapped in a portion of the charge storage layer disposed on an intersection between the word lines and the channel layer, the memory cells store data.

SUMMARY

An aspect of the invention provides a semiconductor memory device including a stacked structure including conductive patterns and interlayer insulating patterns which are alternately stacked. The semiconductor memory device may also include a through-hole configured to pass through the stacked structure. In addition, the semiconductor memory device may include a channel pattern formed inside the through-hole. Further, the semiconductor memory device may include a first capping conductive pattern formed on the channel pattern. The semiconductor memory device may also include a second capping conductive pattern formed on a sidewall of the first capping conductive pattern and surrounding the first capping conductive pattern. Further, the semiconductor memory device may include a contact plug formed on the first capping conductive pattern and the second capping conductive pattern.

An aspect of the invention provides a method of manufacturing a semiconductor memory device, which includes alternately stacking first material layers and second material layers. The method also includes forming a mask pattern which includes a first open area on the first material layers and the second material layers. Further, the method includes etching the first material layers and the second material layers exposed through the first open area, and forming a through-hole which passes through the first material layers and the second material layers. In addition, the method includes forming a channel pattern along a surface of the through-hole. The method also includes filling an opening of the mask pattern disposed on the channel pattern with a first capping conductive pattern. Further, the method includes retaining a portion of the mask pattern on a sidewall of the first capping conductive pattern and forming an interlayer insulating layer on an entire structure. In addition, the method includes etching the interlayer insulating layer to form a contact hole which exposes the first capping conductive pattern and a portion of the mask pattern. The method also includes removing the mask pattern, which is exposed, filling a space, from which the mask pattern is removed, with a conductive material and forming a second capping conductive pattern which surrounds the first capping conductive pattern and a contact plug.

An aspect of the invention provides a method of manufacturing a semiconductor memory device, which includes alternately stacking first material layers and second material layers. The method also includes etching the first material layers and the second material layers and forming a through-hole which passes through the first material layers and the second material layers. Further, the method includes forming a channel pattern inside the through-hole. The method also includes forming a first capping conductive pattern on an upper portion of the channel pattern. The method also includes forming a sacrificial pattern which surrounds the first capping conductive pattern on a sidewall of the first capping conductive pattern. In addition, the method includes forming an interlayer insulating layer on an overall structure including the first capping conductive pattern and the sacrificial pattern, and forming a contact hole to expose the first capping conductive pattern and a portion of the sacrificial pattern. The method also includes removing the sacrificial pattern, filling a space from which the sacrificial pattern is removed with a conductive material and forming a second capping conductive pattern which surrounds the first capping conductive pattern.

BRIEF DESCRIPTION OF THE DRAWINGS

FIGS. 2A to 2F are cross-sectional views illustrating a method of manufacturing the semiconductor device according to an embodiment of the invention;

DETAILED DESCRIPTION

Figure 1:
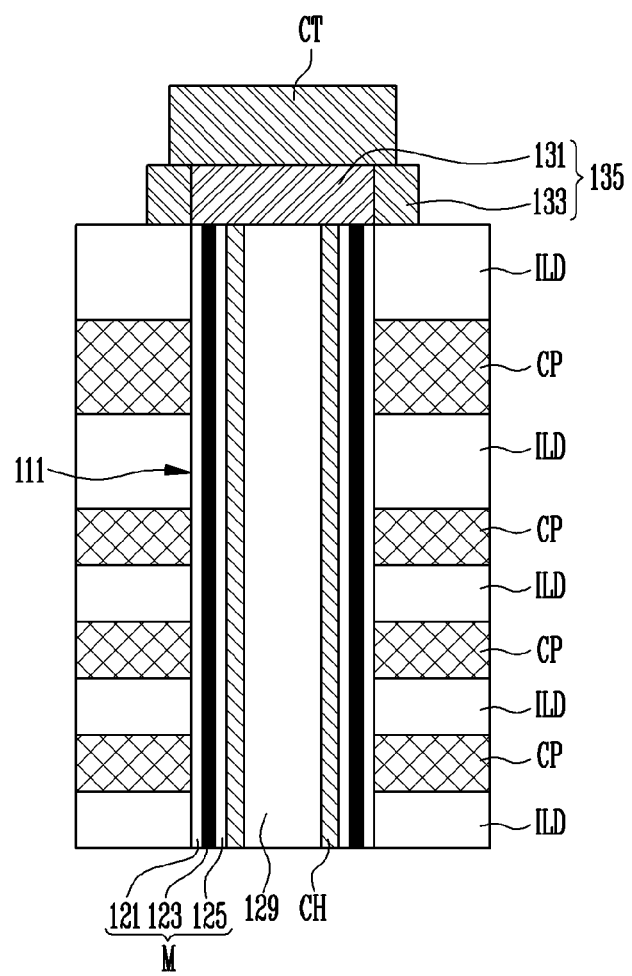
FIG. 1 is a cross-sectional view illustrating a semiconductor device according to an embodiment of the invention.

The invention will be described more fully with reference to the accompanying drawings in which embodiments of the invention are shown. This invention may, however, be embodied in different forms and should not be construed as limited to the embodiments set forth. The invention is directed to a semiconductor memory device capable of improving a margin of a contact electrically coupled to a vertical channel of a 3-dimensional semiconductor memory device, and a method of manufacturing the semiconductor memory device In the drawings, a thickness and an interval are expressed for convenience of explanation, and may be exaggerated with a real physical thickness. In the explanation of the embodiments of the invention, structures which are not related to the gist of the invention may be omitted. Like numbers refer to like elements throughout. Thus, the same or similar numbers may be described with reference to other drawings even if they are neither mentioned nor described in the corresponding drawing.

Referring to FIG. 1, a cross-sectional view illustrating a semiconductor device according to an embodiment of the invention is shown.

The semiconductor device n includes a structure in which conductive patterns CP and interlayer insulating patterns ILD are alternately stacked. The semiconductor device also includes a through-hole 111 which passes through the stacked structure. In addition, the semiconductor device includes a through-structure formed inside the through-hole 111, and a capping conductive pattern 135 which is formed on the through-structure and has a greater width than the through-hole 111. The capping conductive pattern 135 includes a first capping conductive pattern 131 which has the same width as the through-hole 111. Further, the capping conductive pattern 135 also includes a second capping conductive pattern 133 which surrounds a sidewall of the first capping conductive pattern 131. In addition, a contact plug CT is formed on an upper portion of the capping conductive pattern 135, and the capping conductive pattern 135 is electrically coupled to the contact plug CT.

The conductive patterns CP included in the stacked structure may include at least one of a polysilicon layer, a metal layer, and a metal silicide layer. The interlayer insulating pattern ILD may include a silicon oxide layer. An uppermost insulating pattern of the interlayer insulating patterns ILD may be disposed as an uppermost layer of the stacked structure. At least one conductive pattern selected from an uppermost layer of the conductive patterns CP may be used as a select line of a nonvolatile memory device.

The through-structure includes a multilayered dielectric pattern M, a channel pattern CH and a core insulating layer 129. Although only a portion of the through-structure is shown in FIG. 1, a general shape of the through-structure may be various shapes. Various shapes may be such as a straight type, a U-shape, a W-shape, and/or the like, based on a shape of a cell structure to be formed.

The core insulating layer 129 may fill a central area of the through-hole 111. The core insulating layer 129 may also include a silicon oxide layer which is formed by annealing a polysilazane (PSZ).

The channel pattern CH may surround the core insulating layer 129. The channel pattern CH may also have a tube shape along an inner surface of the through-hole 111. The channel pattern CH may include a semiconductor material, for example, and may be formed by an undoped polysilicon layer. Unlike the above-mentioned, the channel pattern CH may fill the central area of the through-hole 111. In this case, the core insulating layer 129 may not be formed.

The multilayered dielectric pattern M may include a tunnel insulating layer 125 which surrounds the channel pattern CH. The multilayered dielectric pattern M may also include a data storage layer 123 which surrounds the tunnel insulating layer 125, and a charge blocking layer 121 which surrounds the data storage layer 123. The tunnel insulating layer 125 may include an insulating material capable of tunneling charges, and for example, may be formed by a silicon oxide layer. The data storage layer 123 may include a material capable of trapping charges, and for example, may be formed by a silicon nitride layer. The charge blocking layer 121 may include an insulating material capable of blocking charges. The charge blocking layer 121 may also include for example, at least one of a silicon oxide layer and a high dielectric layer having a dielectric constant higher than the silicon oxide layer.

The capping conductive pattern 135 covers the core insulating layer 129, the channel pattern CH, and the multilayered dielectric pattern M. The capping conductive pattern 135 also has a greater width than the through-hole 111. The capping conductive pattern 135 may include the first capping conductive pattern 131 and the second capping conductive pattern 133. Further, the second capping conductive pattern 133 may include the same material as the contact plug CT. Since the second capping conductive pattern 133 surrounds a sidewall of the first capping conductive pattern 131, the capping conductive pattern 135 has a greater width than the through-hole 111. Accordingly, a contact area between the capping conductive pattern 135 and the contact plug CT is increased so as to decrease a resistance, and an overlay margin during formation of the contact plug CT may be improved. The first capping conductive pattern 131 may include an undoped polysilicon layer or a doped polysilicon layer.

As described above descriptions, in an embodiment of the invention, since the capping conductive pattern 135 has the greater width than the through-hole 111, the overlay margin of the contact plug CT, which is formed on the capping conductive pattern 135, is improved. Further, the electrical contact area between the contact plug CT and the capping conductive pattern 135 is increased so as to decrease a resistance.

Referring to FIGS. 2A to 2F, cross-sectional views illustrating a method of manufacturing the semiconductor device according to an embodiment of the invention are shown. In particular, FIGS. 2A to 2F are cross-sectional views illustrating the method of manufacturing the semiconductor device shown in FIG. 1.

Figure 2A:
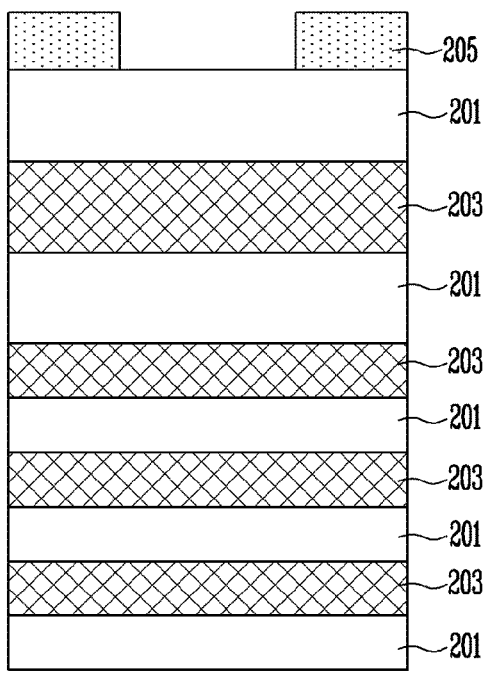

Referring to FIG. 2A, first material layers 201 and second material layers 203 are alternately stacked on a lower structure to form a stacked structure.

The lower structure may be various and changed based on a shape of a cell structure to be formed. For example, the lower structure may include a semiconductor substrate including a source area, or a pipe gate including pipe channel holes filled with a sacrificial layer.

The number of the stacked first and second material layers 201 and 203 may be variously set. The first material layers 201 may be formed in layers in which interlayer insulating patterns may be formed. The second material layers 203 may be formed in layers in which conductive patterns may be formed. The second material layers 203 may have different materials from the first material layers 201. In particular, the second material layers 203 may have a different etch selectivity from the first material layers 201. For example, the first material layers 201 may be formed of a material for the interlayer insulating patterns. In addition, the second material layers 203 may be formed of a material for the conductive patterns. Further, the first material layers 201 may be formed of the material for the interlayer insulating patterns. Further, the second material layers 203 may be formed of a material for the sacrificial layers. An oxide layer, such as a silicon oxide layer, may be used as the material for the interlayer insulating patterns. Moreover, a nitride layer having an etch selectivity with respect to an oxide layer may be used as the material for the sacrificial layer.

After forming the stacked structure including the first and second material layers 201 and 203, a first mask pattern 205 is formed on the stacked structure. The first mask pattern 205 includes a first open area which opens an area to be formed the through-hole. The first mask pattern 205 may include a nitride layer.

Figure 2B:
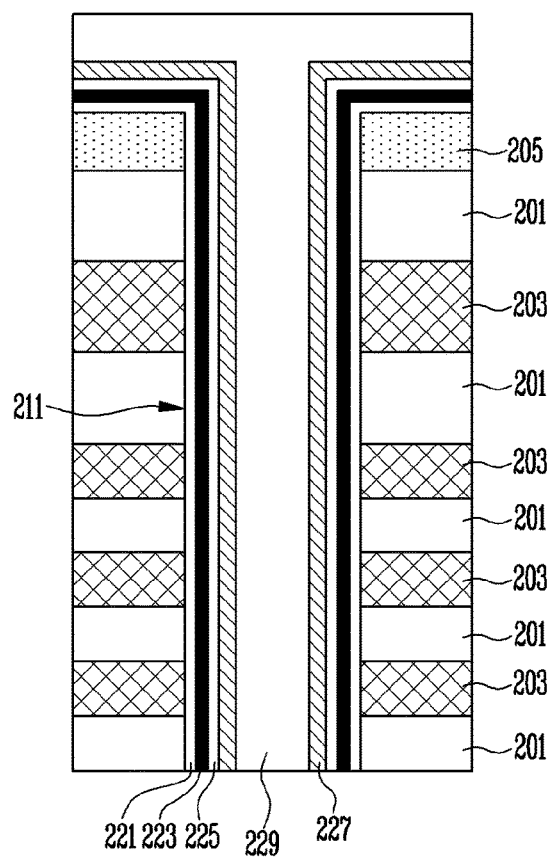

Referring to FIG. 2B, the first and second material layers 201 and 203, which are exposed through the first open area of the first mask pattern 205, are etched to form a through-hole 211 which passes through the first and second material layers 201 and 203. Then, multilayered dielectric layers 221, 223, and 225 are formed along a surface of the through-hole 211 and a surface of the first mask pattern 205. Further, a channel layer 227 is formed along surfaces of the multilayered dielectric layers 221, 223, and 225. The multilayered dielectric layers 221, 223, and 225 are formed by forming the charge blocking layer 221 along the surface of the through-hole 211 and the surface of the first mask pattern 205, forming the data storage layer 223 along the surface of the charge blocking layer 221, and forming the tunnel insulating layer 225 on the surface of the data storage layer 223.

Then, a central area of the open through-hole 211, opened by the channel layer 227, is filled with the core insulating layer 229. The core insulating layer 229 may be formed by filling the central area of the through-hole 211 with a gap-filling material which easily fills a gap, and annealing the gap-filling material. For example, the core insulating layer 229 may be formed by filling the central area of the through-hole 211 with a polysilazane (PSZ), and annealing the PSZ so as to change the PSZ into a silicon oxide layer.

Referring to FIG. 2C, the core insulating layer 229, the channel layer 227, and the multilayered dielectric layers 221, 223, and 225 are etched through an etching process. Preferably, the etching process may be performed so as to expose the first mask pattern 205. For instance, the etching process is performed on the core insulating layer 229, the channel layer 227, and the multilayered dielectric layers 221, 223, and 225 until down to a level of an upper surface of an uppermost first material layer 201.

Then, a first capping conductive pattern 231 is formed in a space between the first mask pattern 205. The first capping conductive pattern 231 may be formed by depositing an undoped polysilicon layer or a doped polysilicon layer on an entire structure including the first mask pattern 205, and performing a planarization process on the structure until an upper portion of the first mask pattern 205 is exposed. The planarization process may be performed by a chemical mechanical polishing (CMP) process.

Then, a second mask pattern 233 is formed on the first capping conductive pattern 231. The second mask pattern 233 may have a greater critical dimension than the first capping conductive pattern 231. The second mask pattern 233 may include a material having an etching selectivity with respect to the first mask pattern 205. For example, the first mask pattern 205 may include a nitride layer. In addition, the second mask pattern 233 may include an oxide layer.

Referring to FIG. 2D, since an etching process is performed using the second mask pattern 233 as an etching mask, a portion of the first mask pattern 205 remains on a sidewall of the first capping conductive pattern 231 and is used as a sacrificial pattern 205A. Then, after the second mask pattern 233 is removed, an interlayer insulating layer 241 is formed on an entire structure including the sacrificial pattern 205A and the first capping conductive pattern 231.

Figure 2E:
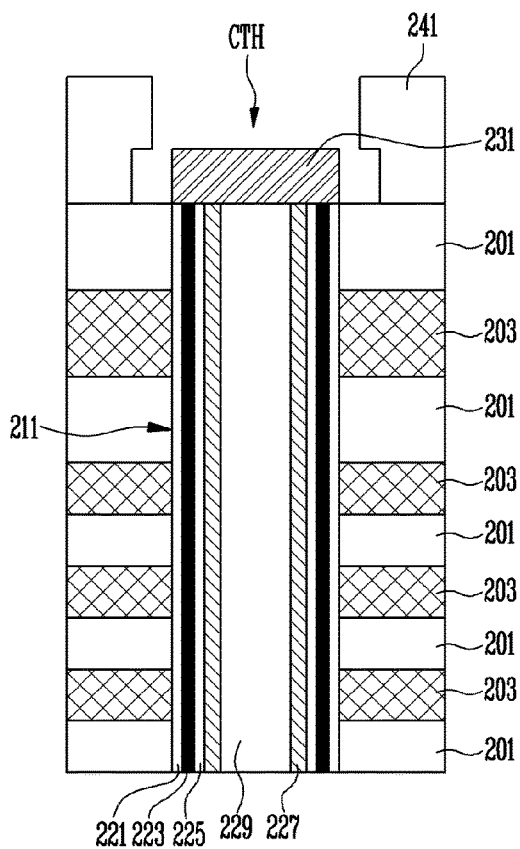

Referring to FIG. 2E, an etching process is performed to form a contact hole CTH to expose an upper portion of the first capping conductive pattern 231. In the formation of the contact hole CTH, when the contact hole CTH is misaligned with the first capping conductive pattern 231 and an upper portion of the sacrificial pattern 205A is exposed, the sacrificial pattern 205A is removed. Further, in the formation of the contact hole CTH, when the contact hole CTH has a greater critical dimension than the first capping conductive pattern 231, the upper portion of the sacrificial pattern 205A is exposed and then the sacrificial pattern 205A may be removed.

Figure 2F:
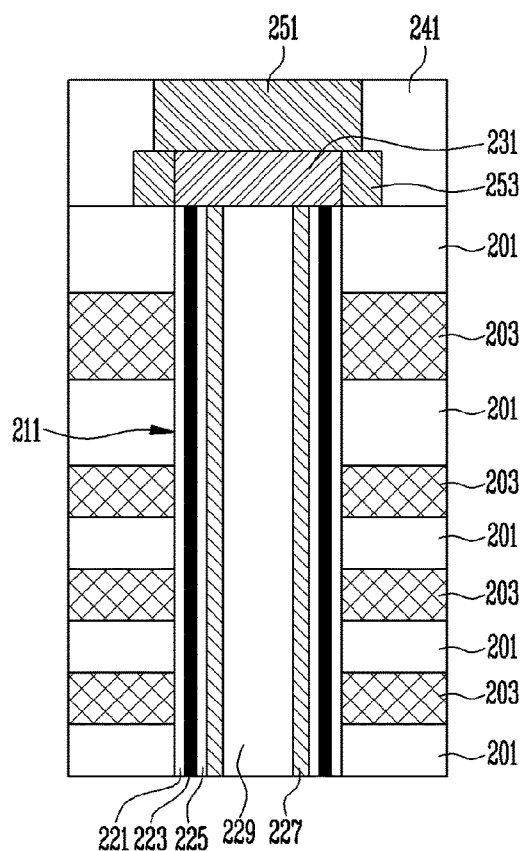

Referring to FIG. 2F, a conductive material fills the contact hole, and the contact plug 251 is formed. The conductive material fills a space in which the sacrificial pattern is removed. In addition, a second capping conductive pattern 253 is formed on the sidewall of the first capping conductive pattern 231.

According to an embodiment of the invention, since the second capping conductive pattern 253 is formed on the sidewall of the first capping conductive pattern 231, the critical dimension of the capping conductive pattern is increased. Thus, the contact area between the conductive pattern and the contact pattern is increased. In addition, the resistance between the conductive pattern and the contact pattern is decreased. Further, although the misalignment occurs during the formation of the contact hole, the second capping conductive pattern 253 is formed on the sidewall of the first capping conductive pattern 231 and defects are decreased during the manufacturing processes.

Figure 3:
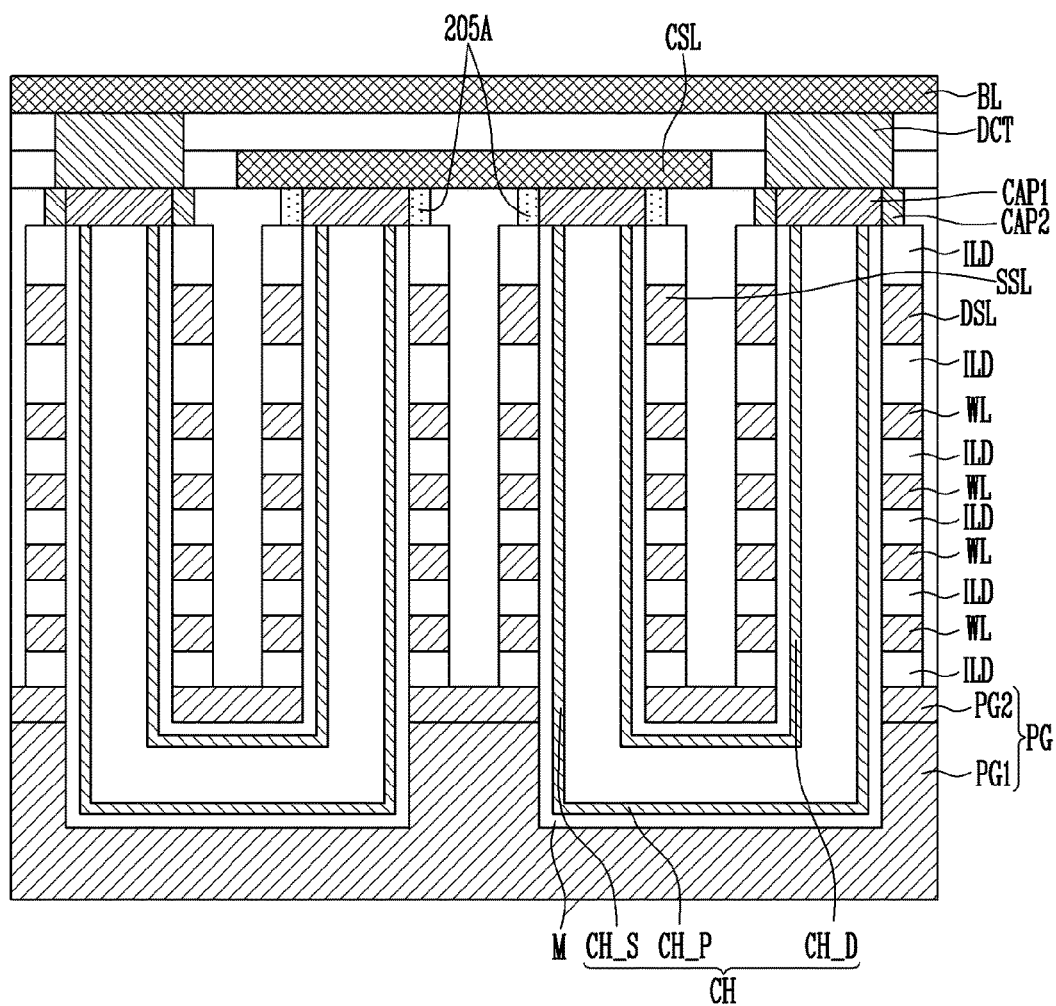
FIG. 3 is a cross-sectional view illustrating a cell structure of the semiconductor device according to an embodiment of the invention.

Referring to FIG. 3, a cross-sectional view illustrating a cell structure of the semiconductor device according to an embodiment of the invention is shown. In particular, FIG. 3 shows memory cells arranged along a through-structure having a U-shape and configured to form a 3-dimensional memory string.

In FIG. 3, the cell structure includes structures in which interlayer insulating patterns ILD and conductive patterns WL, SSL, and DSL are alternately stacked on a pipe gate PG. The stacked structures are disposed on the pipe gate PG. The cell structure may further include a through-structure in a U-shape. As described in FIG. 1, the through-structure includes a core insulating layer 429, a channel pattern CH which surrounds the core insulating layer 429, and a multilayered dielectric pattern M which surrounds the channel pattern CH. The core insulating layer 429, the channel pattern CH, and the multilayered dielectric pattern M have the same materials as described in FIG. 1.

The stacked structures include a source-side stacked structure and a drain-side stacked structure. Conductive patterns included in the source-side stacked structure include at least one first selection line SSL and word lines WL interposed between the first selection line SSL and the pipe gate PG. Conductive patterns included in the drain-side stacked structure include at least one second selection line DSL and word lines WL interposed between the second selection line DSL and the pipe gate PG. The first selection line SSL may include a source selection line. Further, the second selection line DSL may include a drain selection line.

The channel pattern CH includes a first straight channel part CH_S which passes through the source-side stacked structure, a second straight channel part CH_D which passes through the drain-side stacked structure, and a pipe channel part CH_P which electrically couples the first straight channel part CH_S to the second straight channel part CH_D. The pipe channel part CH_P may be disposed under the stacked structures and may be surrounded by the pipe gate PG. The number of the straight channel parts electrically coupled to the pipe channel part CH_P may not be limited to be two, but may be changed to two or more based on a shape of the through-structure. For example, when the through-structure has a W-shape, three straight channel parts which pass through the stacked structures may be electrically coupled to the pipe channel part CH_P.

The pipe gate PG may include a first pipe gate PG1 which covers a sidewall and a bottom surface of the pipe channel part CH_P. The pipe gate PG may also include a second pipe gate PG2 which covers an upper surface of the pipe channel part CH_P on the first pipe gate PG1.

The source-side stacked structure and the drain-side stacked structure may be isolated by a slit formed between the first straight channel part CH_S and the second straight channel part CH_D.

In the above descriptions, the second straight channel part CH_D may contact a first capping conductive pattern CAP1 which protrudes from a level of an uppermost surface of the stacked structures, and a second capping conductive pattern CAP2 which surrounds a side surface of the first capping conductive pattern CAP1. A shape and a material of each capping conductive pattern CAP are the same as those described with FIG. 1. However, a sacrificial pattern 205A instead of the second capping conductive pattern CAP2 may remain on the sidewall of the first capping conductive pattern CAP1 electrically coupled to the first straight channel part CH_S. In the case of the second straight channel part CH_D, the first capping conductive pattern CAP1 and the second capping conductive pattern CAP2 are electrically coupled to a drain contact plug DCT. However, in the case of the first straight channel part CH_S, since the first capping conductive pattern CAP1 is directly electrically coupled to a source line CSL without a contact plug and the formation of the contact hole may be omitted, the sacrificial pattern 205A instead of the second capping conductive pattern CAP2 may remain. In an embodiment of the invention, since the drain contact plug DCT is formed on the first and second capping conductive patterns CAP1 and CAP2 which have a greater width than the drain contact plug DCT, a misalignment between the contact plug DCT and the first and second capping conductive patterns CAP1 and CAP2 is decreased. In addition, a resistance between the drain contact plug DCT and the first and second capping conductive patterns CAP1 and CAP2 is decreased.

According to the above-mentioned structure, at least one of the drain selection transistors, the memory cells, and at least one of the source selection transistors, which are electrically coupled in series, constitute one memory string, and are arranged in a U-shape.

The method of manufacturing the cell structure may include forming the pipe gate PG including the pipe trench filled with the sacrificial layer, and then performing the processes shown in FIGS. 2A to 2F.

Figure 4:
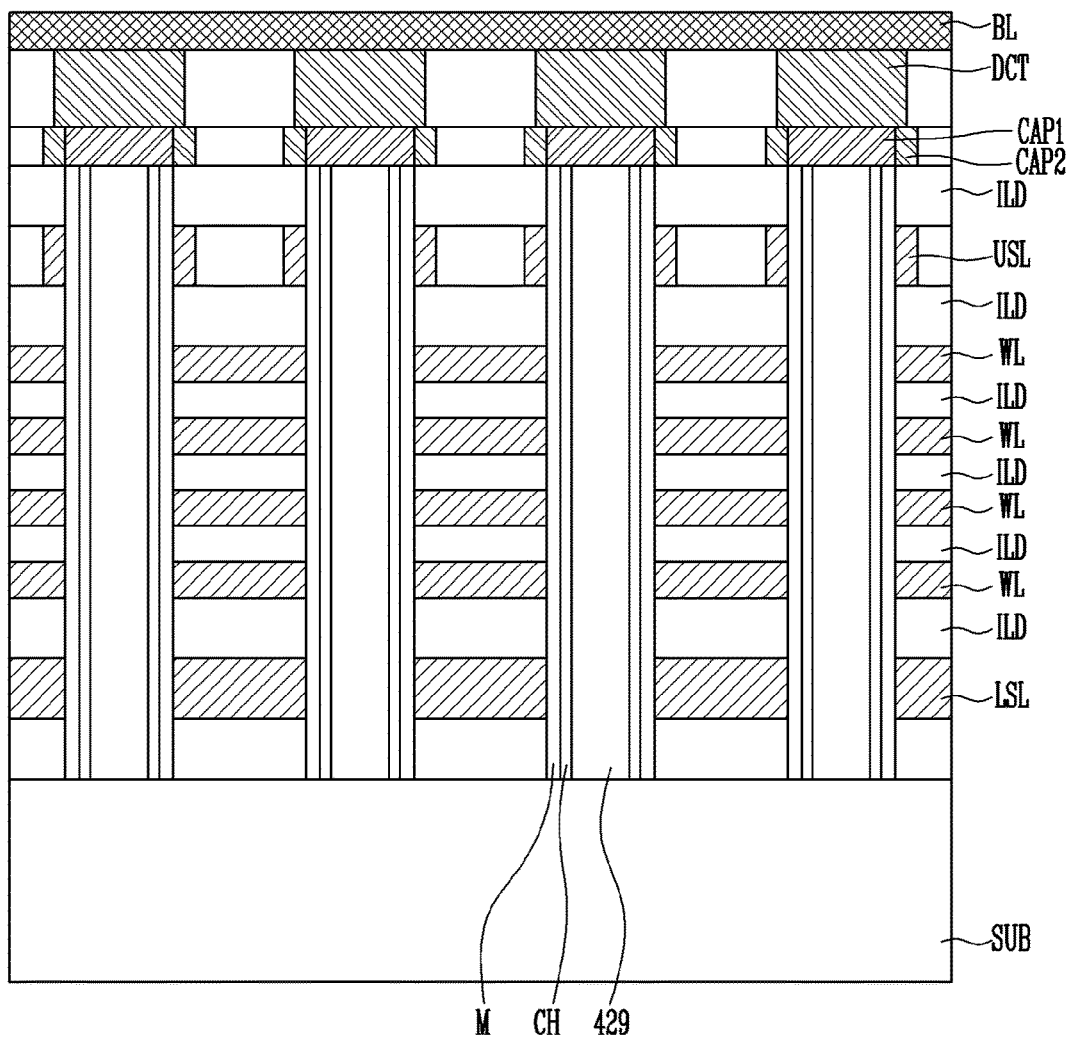
FIG. 4 is a cross-sectional view illustrating a cell structure of a semiconductor device according to an embodiment of the invention.

Referring to FIG. 4, a cross-sectional view illustrating a cell structure of a semiconductor device according to an embodiment of the invention is shown. In particular, FIG. 4 shows memory cells arranged along a through-structure in a straight type and configured to form a 3-dimensional memory string.

Referring to FIG. 4, the cell structure includes interlayer insulating patterns ILD and conductive patterns LSL, WL, and USL, which are stacked alternately on a semiconductor substrate SUB having a source area. The cell structure may further include a through-structure in a straight type. As described in FIG. 1, the through-structure includes a core insulating layer 429, a channel pattern CH which surrounds the core insulating layer 429, and a multilayered dielectric pattern M which surrounds the channel pattern CH. The core insulating layer 429, the channel pattern CH, and the multilayered dielectric pattern M have the same material as that of FIG. 1.

The conductive patterns LSL, WL, and USL may include at least one first selection line LSL, word lines WL disposed on the first selection line LSL, and at least one second selection line USL disposed on the word lines WL. In this instance, the word lines WL may be formed in a plate shape. Further, one of the first and second selection lines USL and LSL may be formed in line shapes. In addition, the word lines WL and the first and second selection lines USL and LSL may be formed in line shapes.

A lower portion of the channel pattern CH may be electrically coupled to a source area of the semiconductor substrate SUB. The channel pattern CH may protrude from a level of an uppermost surface of the interlayer insulating patterns ILD and the conductive patterns LSL, WL, and USL which are alternately stacked, and contact a first capping conductive pattern CAP1. A second capping conductive pattern CAP2 is formed on a sidewall of the first capping conductive pattern CAP1. Shapes and materials of the first and second capping conductive patterns CAP1 and CAP2 may be same as those described in FIG. 1. A drain contact plug DCT is electrically coupled on the first and second capping conductive patterns CAP1 and CAP2. In an embodiment of the invention, since the drain contact plug DCT is formed on the first and second capping conductive patterns CAP1 and CAP2, a misalignment between the drain contact plug DCT and the first and second capping conductive patterns CAP1 and CAP2 is decreased and a resistance between the drain contact plug DCT and the first and second capping conductive patterns CAP1 and CAP2 is decreased. A bit line BL which is a conductive line may be electrically coupled to the drain contact plug DCT.

According to the above-mentioned structure, at least one of the first selection transistors, the memory cells, and at least one of the second selection transistors, which are electrically coupled in series, constitute one memory string, and are arranged in a line shape.

The above-mentioned cell structure may be formed on the semiconductor substrate SUB including a source area using the processes shown in FIGS. 2A to 2F.

Figure 5:
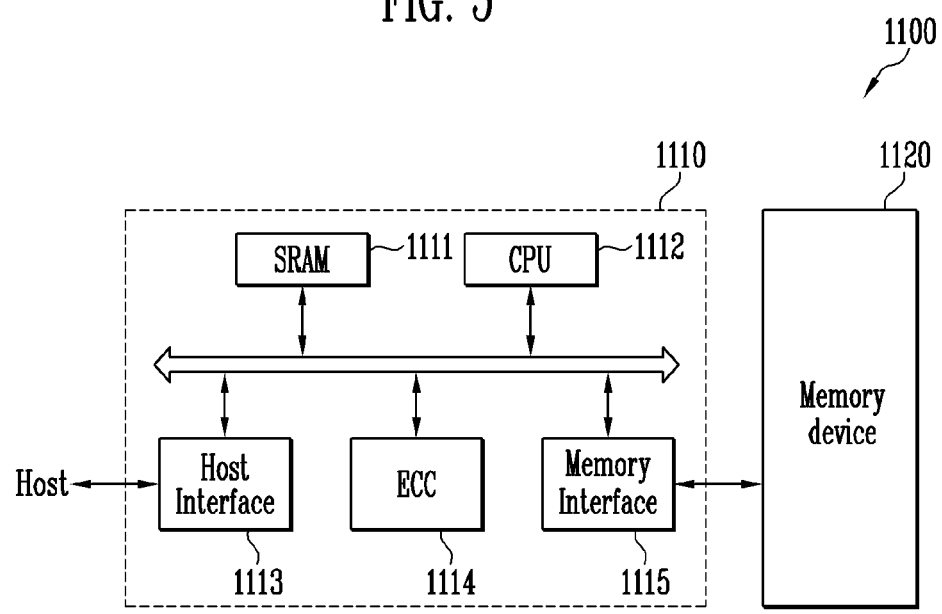
FIG. 5 is a configuration diagram illustrating a memory system according to an embodiment of the invention.

Referring to FIG. 5, a configuration diagram illustrating a memory system according to an embodiment of the invention is shown.

The memory system 1100 of an embodiment of the invention includes a memory device 1120 and a memory controller 1110.

The memory device 1120 may have the same structures shown in FIGS. 1 to 4. In addition, the memory device 1120 may have a multi-chip package including a plurality of flash memory chips.

The memory controller 1110 may be configured to control the memory device 1120, and include an SRAM 1111, a CPU 1112, a host interface 1113, an error correction code (ECC) 1114, and a memory interface 1115. The SRAM 1111 is used for an operation memory of the CPU 1112. The CPU 1112 performs overall control operations to exchange data with the memory controller 1110. The host interface 1113 includes a data exchange protocol of a host Host electrically coupled with the memory system 1100. In addition, the ECC 1114 detects and corrects an error in the data read from the memory device 1120. The memory interface 1115 interfaces with the memory device 1120. The memory controller 1110 may further include a ROM which stores code data to interface with the host Host.

The memory system 1100 having the above-mentioned structure may include a memory card or a solid state disk (SSD) which is a combination of the memory device 1120 and the memory controller 1110. For example, when the memory system 1100 is the SSD, the memory controller 1110 may communicate with the outside (for example, the host Host) through one of various interface protocols such as USB, MMC, PCI-E, SATA, PATA, SCSI, ESDI, IDE, and/or the like.

Figure 6:
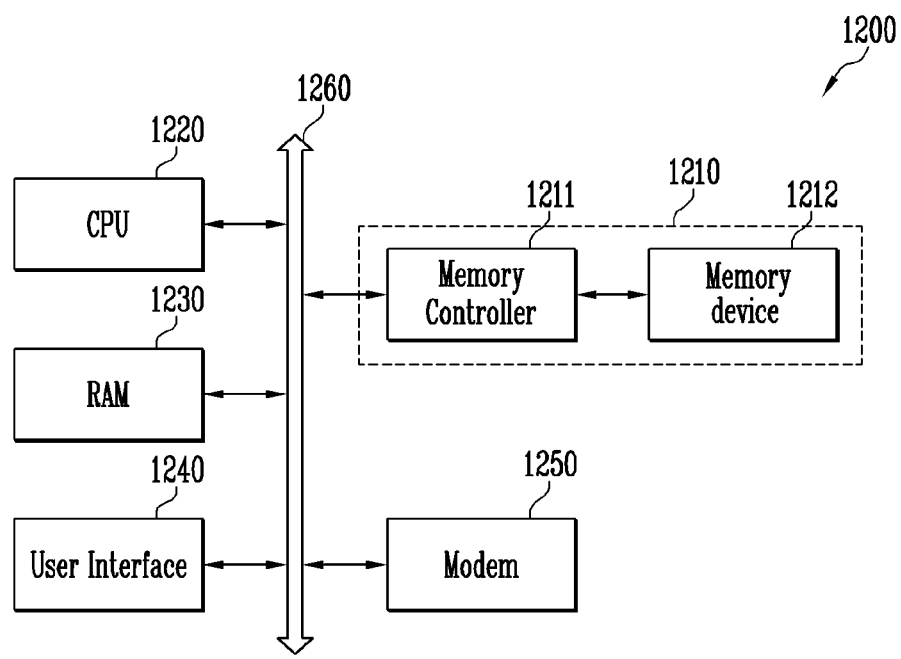
FIG. 6 is a configuration diagram illustrating a computing system according to an embodiment of the invention.

Referring to FIG. 6, a configuration diagram illustrating a computing system according to an embodiment of the invention is shown.

Referring to FIG. 6, the computing system 1200 of an embodiment of the invention may include a CPU 1220, a RAM 1230, a user interface 1240, a modem 1250, and a memory system 1210, which are electrically coupled to a system bus 1260. In addition, when the computing system 1200 is a mobile device, the computing system 1200 may further include a battery to supply an operation voltage to the computing system 1200, and may further include an application chipset, a camera image processor (CIS), a mobile DRAM, and/or the like.

As shown in FIG. 5, the memory system 1210 may include a memory device 1212 and a memory controller 1211.

According to an embodiment of the invention, since the auxiliary conductive pattern is formed on the side surface of the gate capping conductive pattern when the contact electrically coupled to the channel of the semiconductor memory device of the 3-dimensional structure is formed, a margin of the contact electrically coupled to the gate capping conductive pattern may be improved.

In the drawings and specification, there have been disclosed typical embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made without departing from the spirit and scope of the invention as defined by the following claims.

What is claimed is:

1. A semiconductor memory device comprising:
   a stacked structure including conductive patterns and interlayer insulating patterns which are alternately stacked;
   a through-hole configured to pass through the stacked structure, wherein the through-hole has a width;
   a channel pattern formed inside the through-hole;
   a first capping conductive pattern formed on the channel pattern, wherein the first capping conductive pattern has the same width; and
   a conductive material formed surrounding the first capping conductive pattern and on the first capping conductive pattern, wherein a portion of the conductive material formed surrounding the first capping conductive pattern is a second capping conductive pattern and another portion of the conductive material formed on the first capping conductive pattern is a contact plug, wherein an inner diameter of the conductive material has the same width, and an outer diameter of the conductive material is greater than the inner diameter.

2. The semiconductor memory device of claim 1, wherein the second capping conductive pattern is formed of the same material as the contact plug and formed at the same time as the contact plug.

3. The semiconductor memory device of claim 1, further comprising:
   a multilayered dielectric pattern configured to surround the channel pattern along an inner surface of the through-hole.

4. The semiconductor memory device of claim 1, wherein a sum of critical dimensions of the first and second capping conductive patterns is greater than a critical dimension of the through-hole.

5. The semiconductor memory device of claim 1, wherein the contact plug is electrically coupled to a bit line.

6. The semiconductor memory device of claim 1, wherein the channel pattern is formed in a straight type.

7. The semiconductor memory device of claim 6, further comprising:
   a semiconductor substrate including a source area electrically coupled under the channel pattern formed in the straight type and disposed under the stacked structure.

8. The semiconductor memory device of claim 1, wherein the channel pattern further comprises:
   at least two straight channel parts configured to pass through the stacked structure;
   a pipe channel part configured to electrically couple the straight channel parts under the stacked structure; and
   a pipe gate configured to surround the pipe channel part.

9. The semiconductor memory device of claim 8, wherein the first and second capping conductive patterns are formed on channel parts electrically coupled to a bit line of the at least two straight channel parts, and
   a mask pattern is formed on channel parts electrically coupled to a source line of the at least two straight channel parts, and surrounds the first capping conductive pattern.

* * * * *